(12) United States Patent
Chang et al.

(10) Patent No.: US 9,268,443 B2
(45) Date of Patent: Feb. 23, 2016

(54) CAPACITIVE TOUCH PANEL WITH ELECTRODE PAIRS

(71) Applicant: Chunghwa Picture Tubes, LTD., Taoyuan (TW)

(72) Inventors: Shu-Ming Chang, Taoyuan County (TW); Shu-Wen Chang, Taoyuan County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 314 days.

(21) Appl. No.: 13/781,776

(22) Filed: Mar. 1, 2013

(65) Prior Publication Data

US 2014/0158513 A1    Jun. 12, 2014

(30) Foreign Application Priority Data

Dec. 11, 2012    (TW) .................................. 101146709

(51) Int. Cl.
*G06F 3/044*    (2006.01)
*H03K 17/96*    (2006.01)

(52) U.S. Cl.
CPC ............ *G06F 3/044* (2013.01); *H03K 17/9622* (2013.01); *H03K 2017/9602* (2013.01)

(58) Field of Classification Search
CPC .................. H03K 17/9622; H03K 2017/9602; G06F 3/044
USPC .................................................. 345/156, 173
See application file for complete search history.

(56) References Cited

U.S. PATENT DOCUMENTS

2010/0149108 A1*    6/2010    Hotelling et al. ............. 345/173
2011/0017523 A1     1/2011    Bulea et al.
(Continued)

FOREIGN PATENT DOCUMENTS

TW    M431368    6/2012
TW    201243676  11/2012

OTHER PUBLICATIONS

"Office Action of Taiwan Counterpart Application", issued on Oct. 9, 2014, p. 1-p. 4, in which the listed references were cited.

(Continued)

*Primary Examiner* — Jonathan Horner
(74) *Attorney, Agent, or Firm* — Jianq Chyun IP Office

(57) ABSTRACT

A touch panel connected with p signal channels of a chip is provided. The touch panel includes a substrate, electrode pairs, and signal lines. The electrode pairs are arranged in a matrix of q columns and r rows and each includes a first electrode connected to the $h^{th}$ signal channel and a second electrode connected to the $i^{th}$ signal channel. The $h^{th}$ signal channel and the $i^{th}$ channel are served as a signal channel pair. The signal channel connected with the electrode pair arranged in the $j^{th}$ column of the $k^{th}$ row is different from the signal channel connected with the other electrode pairs. The signal lines are electrically connected between the first electrodes or the second electrodes to the corresponding signal channels.

4 Claims, 4 Drawing Sheets

(56) References Cited

U.S. PATENT DOCUMENTS

2011/0084936 A1* 4/2011 Chang et al. .......... 345/174
2011/0298744 A1   12/2011 Souchkov

OTHER PUBLICATIONS

"Office Action of China Counterpart Application", issued on Mar. 17, 2015, p. 1-p. 3, in which the listed references were cited.

* cited by examiner

120A

120B

120C

120D

CAPACITIVE TOUCH PANEL WITH ELECTRODE PAIRS

CROSS-REFERENCE TO RELATED APPLICATION

This application claims the priority benefit of Taiwan application serial no. 101146709, filed on Dec. 11, 2012. The entirety of the above-mentioned patent application is hereby incorporated by reference herein and made a part of this specification.

BACKGROUND

1. Technical Field

The invention relates to a touch panel, and more particularly, to a capacitive touch panel.

2. Background

At present, the touch panels can be generally classified into resistive, capacitive, infrared, and ultrasonic touch panels, wherein the resistive touch panels and the capacitive touch panels are most common.

Generally, the capacitive touch panel includes multiple first sensing series arranged in a first direction and multiple second sensing series arranged in a second direction which are disposed on the substrate. The first sensing series are consisted of multiple first sensing electrodes and multiple first bridges. The second sensing series are consisted of multiple second sensing electrodes and multiple second bridges. In addition, the first direction is intersected with the second direction. The first sensing series and the second sensing series are mutually intersected and are electrically insulated with each other. Accordingly, the first sensing series and the second sensing series are made by at least two conductive layers through at least two fabrication processes.

SUMMARY

The present invention is directed to a touch panel equipped with the signal lines having novel design.

The invention provides a touch panel connected with p signal channels of a chip. The touch panel includes a substrate, s plurality of electrode pairs, and a plurality of signal lines. The electrode pairs are disposed on the substrate and arranged in a matrix of q columns and r rows, wherein p, q and r are respectively a positive integer. Each electrode pair includes a first electrode and a second electrode. The first electrode is connected to a $h^{th}$ signal channel and the second electrode is connected to an $i^{th}$ signal channel. The $h^{th}$ signal channel and the $i^{th}$ channel together are served as a signal channel pair. Herein, h is not equivalent to i and h and i are respectively a positive integer from 1~p. In addition, j is a positive integer of 1~q and k is a positive integer of 1~r. The signal channel pair connected with the electrode pair arranged in the $j^{th}$ column of the $k^{th}$ row is different from the signal channel pair connected with each of the other electrode pairs. For each electrode pair, the first electrode is scanned and the second electrode senses a touch at a first time sequence, while the second electrode is scanned and the first electrode senses a touch at a second time sequence. Each of the signal lines electrically connect one of the first electrodes and the second electrodes to the corresponding signal channel, wherein at least one of the signal lines connects with at least two of the first electrodes and/or the second electrodes connected with the same signal channel.

In view of the above, the touch panel according to the invention utilizes a design that the first electrode and the second electrode of the same electrode pair being connected with different signal channels of a chip and different electrode pairs being connected to different signal channel pairs. Accordingly, each of the first electrode and the second electrode in the same electrode pair can be served as the scanning electrode and the sensing electrode via the signal channels driven at different time sequences. Thereby, the touch sensing resolution of the touch panel can be improved.

In order to make the aforementioned features of the disclosure more comprehensible, embodiments accompanied with figures are described in details below.

DESCRIPTION OF EMBODIMENTS

Figure 1:
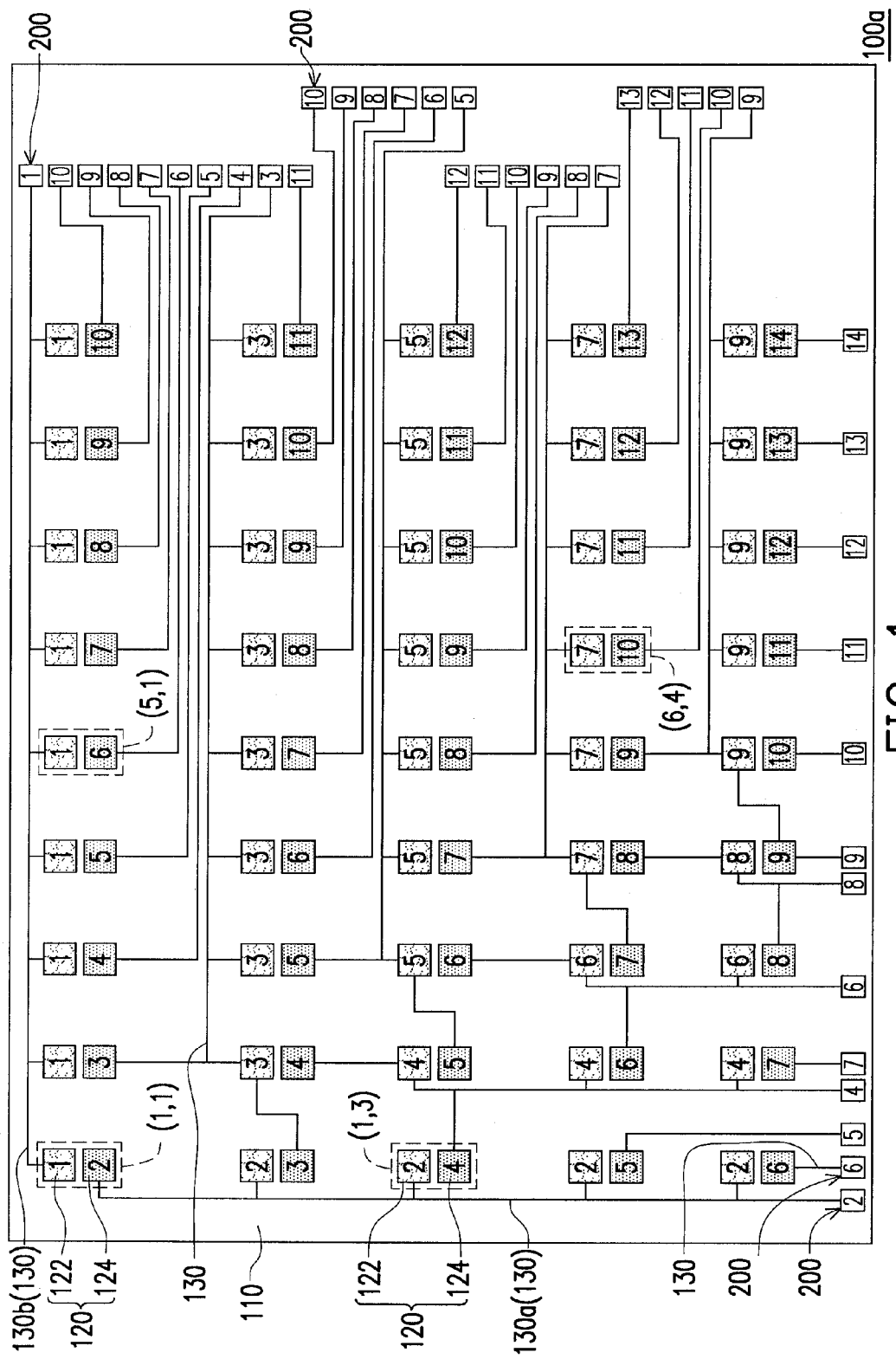
FIG. 1 is a schematic top view of a touch panel according to a first embodiment of the present invention.
Figure 2A:
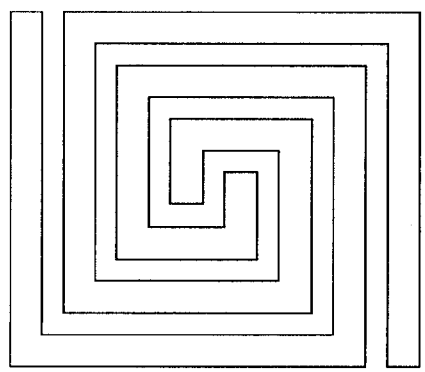
FIG. 2A through FIG. 2D are schematic diagrams illustrating the structures of the electrode pairs in accordance with several embodiments of the present invention.
Figure 2B:
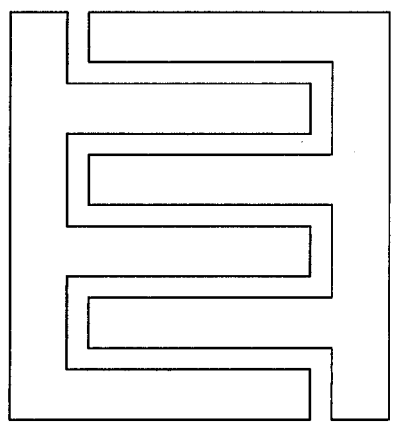
Figure 2C:
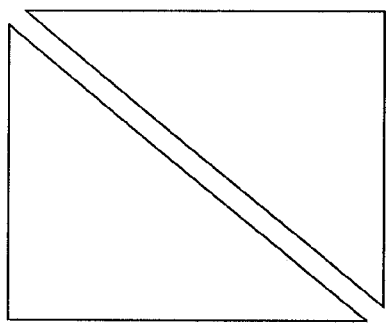
Figure 2D:
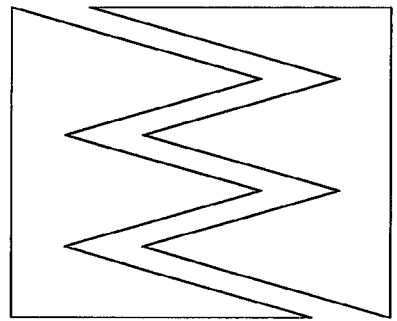

FIG. 1 is a schematic top view of a touch panel according to a first embodiment of the present invention. Referring to FIG. 1, the touch panel 100a according to the present embodiment is connected to p signal channels of a chip through a plurality of pads 200, wherein p is a positive integer such as 14, for example. Specifically, the reference number 1~14 correspondingly marked in the pads 200 depicted in FIG. 1 represent the serial numbers of the signal channels of the chip. The touch panel 100a includes a substrate 110, a plurality of electrode pairs 120, and a plurality of signal lines 130.

The electrode pairs 120 are disposed on the substrate 110. The electrode pairs 120 are arranged in a matrix layout, and specifically, are arranged in a matrix of q columns and r rows. Here, q and r are respectively a positive integer. In the present embodiment, q is 9 and r is 5, for example. Therefore, the touch panel 100a having the electrode pairs 120 arranged in a matrix of 9 columns and 5 rows is taken as an illustrative example herein. Certainly, the invention is not limited thereto.

In another embodiment, the electrode pairs 120 can be arranged in a matrix having more or less columns and more or less rows. It is noted that the reference number pair (j,k) denoted in the following represents the arranged position being the $j^{th}$ column of the $k^{th}$ row in the matrix, wherein j is a positive integer of 1~q and k is a positive integer of 1~r. For example, the reference number pair (1,1) in FIG. 1 represents that the arranged position of the electrode pair 120 is the first column of the first row, the reference number pair (5,1) in FIG. 1 represents that the arranged position of the electrode pair 120 is the fifth column of the first row, and so forth. In the present embodiment, j can be from 1 to 9 and k can be from 1 to 5.

Each electrode pair 120 includes a first electrode 122 and a second electrode 124. The first electrode 122 is connected to the $h^{th}$ signal channel of the chip through the corresponding pad 200 and the second electrode 124 is connected to the $i^{th}$ signal channel of the chip through another pad 200. The $h^{th}$ signal channel and the $i^{th}$ channel of the chip together are served as a signal channel pair, wherein h is not equivalent to i and h and i are both from 1 to p. In other words, the first electrode 122 and the second electrode 124 of the same electrode pair 120 can be connected to two different signal channels and the two different signal channels are served as a signal channel pair for descriptive purpose.

Notably, the reference numbers 1~14 correspondingly marked in the first electrodes 122 and the second electrodes 124 depicted in FIG. 1 represent the serial numbers of the connected signal channels of the chip. For example, one of the first electrodes 122 marked with 2 represents the first electrode 122 is connected to the $2^{nd}$ signal channel of the chip. In the embodiment, 14 signal channels are illustrated, and thus h and i are respectively a positive integer from 1 to 14. In other words, the chip connected to the touch panel 100a has 14 individual signal channels of the $1^{st}$ to the $14^{th}$ signal channels.

In addition, the signal channel pair connected with the electrode pair 120 arranged in the $j^{th}$ column of the $k^{th}$ row is different from the signal channel pair connected with each of the other electrode pairs 120. For instance, the signal channel pair connected with the electrode pair 120 arranged in the $1^{st}$ column of the $3^{rd}$ row is consisted of the $2^{nd}$ signal channel to which the corresponding first electrode 122 is connected and the $4^{th}$ signal channel to which the corresponding second electrode 124 is connected. The signal channel pair connected with the electrode pair 120 arranged in the $5^{th}$ column of the $1^{st}$ row is consisted of the $1^{st}$ signal channel to which the corresponding first electrode 122 is connected and the $6^{th}$ signal channel to which the corresponding second electrode 124 is connected. The signal channel pair connected with the electrode pair 120 arranged in the $6^{th}$ column of the $4^{th}$ row is consisted of the $7^{th}$ signal channel to which the corresponding first electrode 122 is connected and the $10^{th}$ signal channel to which the corresponding second electrode 124 is connected.

In the embodiment, the first electrode 122 and the second electrode 124 of the same electrode pair 120 are separated by a gap d, so that the first electrode 122 and the second electrode 124 are not overlapped and can be formed through the same process. Accordingly, the fabrication process for forming the electrodes of the touch panel 100a becomes simple. The shapes of the first electrodes 122 and the second electrodes 124 are not limited herein. In general, the areas of the first electrodes 122 and the second electrodes 124 can be the same and the shapes thereof can be corresponding to each other, as shown in the electrode pairs 120A~120D depicted in FIG. 2A~FIG. 2D.

The signal lines 130 are electrically connected between the first electrodes 122 and the corresponding pads 200 to be connected to the corresponding signal channels of the chip (not shown) through the pads 200, or electrically connected between the second electrodes 124 and the corresponding pads 200 to be connected to the corresponding signal channel of the chip (not shown) through the pads 200. The electrodes connected with the same signal channel can be electrically connected together through the signal lines 130. In an example, the second electrode 124 arranged in the $1^{st}$ column of the $1^{st}$ row is connected to the $2^{nd}$ signal channel and the first electrodes 122 arranged in the $1^{st}$ column of the $2^{nd}$ to the $5^{th}$ rows are as well as connected to the $2^{nd}$ signal channel. Therefore, the above-mentioned second electrode 124 and the first electrodes 122 can be connected to the same signal line 130a and communicated with the $2^{nd}$ signal channel in the chip through extending the signal line 130a to the corresponding pad 200. Alternately, the first electrodes 122 arranged in the $1^{st}$ column of the $1^{st}$ row to the $9^{th}$ column of the $1^{st}$ row are connected to the $1^{st}$ signal channel. Therefore, these first electrodes 122 can be connected to the same signal line 130b and communicated with the $1^{st}$ signal channel in the chip through extending the signal line 130b to the corresponding pad 200. In the present embodiment, the signal line 130 can connect together the first electrodes 122 to be connected to the same signal channel and be extended to the corresponding pad 200 so as to be connected to the corresponding signal channel in the chip. The signal line 130 can connect together the second electrodes 124 to be connected to the same signal channel and be extended to the corresponding pad 200 so as to be connected to the corresponding signal channel in the chip. Alternately, the signal line 130 can connect together the first electrodes 122 and the second electrodes 124 to be connected to the same signal channel and be extended to the corresponding pad 200 so as to be connected to the corresponding signal channel in the chip.

In the present embodiment, the driving method of each electrode pair 120 includes that the first electrode 122 is scanned and the second electrode 124 senses a touch at a first time sequence and the first electrode 122 senses a touch and the second electrode 124 is scanned at a second time sequence. At the first time sequence, the scanning signal is transmitted to the $1^{st}$ signal channel, for example. Now, the electrodes connected to the $1^{st}$ signal channel include the first electrodes 122 arranged in the $1^{st}$ to the $9^{th}$ columns of the $1^{st}$ row and are scanned. Furthermore, the second electrodes 124 of the electrode pairs 120 arranged in the $1^{st}$ to the $9^{th}$ columns of the $1^{st}$ row all performs a sensing of a touch. Herein, the $2^{nd}$ to the $10^{th}$ signal channels can provide the function for receiving the sensed signals. At the second time sequence, the scanning signal is transmitted to the $2^{nd}$ signal channel, for example. Now, the electrodes connected to the $2^{nd}$ signal channel include the second electrode 124 arranged in the $1^{st}$ column of the $1^{st}$ row and the first electrodes 122 arranged in the $1^{st}$ column of the $2^{nd}$ to $5^{th}$ rows and are scanned. The first electrode 122 in the electrode pair 120 arranged in the $1^{st}$ column of the $1^{st}$ row and the $2^{nd}$ electrodes 124 of the electrode pairs 120 arranged in the $1^{st}$ column of the $2^{nd}$ to the $5^{th}$ rows all can perform a sensing of a touch. Herein, the $1^{st}$ signal channel and the $3^{rd}$ to the $6^{th}$ signal channels can provide the function for receiving the sensing signals.

According to the above driving method, regarding to the electrode pair 120 arranged in the $1^{st}$ column of the $1^{st}$ row, the first electrode 122 is scanned and the second electrode 124 performs the sensing of a touch at the first time sequence, and the second electrode 124 is scanned and the first electrode 122 performs the sensing of a touch at the second time sequence. Therefore, the first electrode 122 in each electrode pair 120 can perform both the scanning function and the sensing function. The second electrode 124 of each electrode pair 120 can also perform the scanning function and the sensing function.

The first electrode 122 and the second electrode 124 in the same electrode pair 120 are respectively connected to different signal channels, such that the first electrode 122 and the second electrode 124 would not receive the scanning signal or performing the sensing function simultaneously. The first electrode 122 of each electrode pair 120 performs the scanning function and the second electrode 124 of the each electrode pair 120 performs the sensing function at a same time sequence. The first electrode 122 of the each electrode pair 120 performs the sensing function and the second electrode 124 of the each electrode pair 120 performs the scanning function at a same time sequence.

In specific, in the case that the user touches a position where the electrode pair 120 arranged in the $6^{th}$ column of the $4^{th}$ row is, the touch action at the position where the electrode pair 120 arranged in the $6^{th}$ column of the $4^{th}$ row can be sensed whether the first electrode 122 connected to the $7^{th}$ signal channel is scanned and the second electrode 124 connected to the $10^{th}$ signal channel performs the sensing function or the second electrode 124 connected to the $10^{th}$ signal channel is scanned and the first electrode 122 connected to the $7^{th}$ signal channel performs the sensing function. Specifically, a first signal can be received by the second electrode 124 connected to the $10^{th}$ signal channel when the first electrode 122 connected to the $7^{th}$ signal channel is scanned. In addition, a second signal can be received by the first electrode 122 connected to the $7^{th}$ signal channel when the second electrode 124 connected to the $10^{th}$ signal channel is scanned. In the case that the touch position is closer to the first electrode 122 in relative to the second electrode 124, the intensity of the first signal and the second signal can be different. Thereby, the touch sensing resolution of the touch position can be improved.

The following descriptions accompanying with the drawing of FIG. 1 according to the present embodiment further describe how the first electrodes 122 and the second electrodes 124 connected to the corresponding signal channels through the signal lines 130 and the pads 200. Regarding the second electrodes 124, the second electrodes 124 located at the $j^{th}$ column of the $k^{th}$ row can be connected to the $(j+k)^{th}$ signal channel, i.e. i can be (j+k). For example, the second electrode 124 located at the $3^{rd}$ column of the $4^{th}$ row can be connected to the $7^{th}$ signal channel. The second electrode 124 located at the $7^{th}$ column of the $5^{th}$ row can be connected to the $12^{th}$ signal channel.

Regarding to the first electrodes 122, the first electrodes 122 can be connected to the signal channels in different methods based on the arranged position thereof. The first connection method applied to the first electrodes 122 located at the $j^{th}$ column of the $k^{th}$ row includes h is equivalent to (2n−1) when j is equivalent to n to q and k is equivalent to n, wherein n is a positive integer, 1≤n≤q, and q is 9 in the present embodiment. For example, in the case that n is 1, the first electrodes 122 of the $1^{st}$ to the $9^{th}$ columns of the $1^{st}$ row are connected to the $1^{st}$ signal channel. In the case that n is 2, the first electrodes 122 of the $2^{nd}$ to the $9^{th}$ columns of the $2^{nd}$ row are connected to the $3^{rd}$ signal channel. In the case that n is 5, the first electrodes 122 of the $5^{th}$ to the $9^{th}$ columns of the $5^{th}$ row are connected to the $9^{th}$ signal channel.

The second connection method applied to the first electrodes 122 located at the $j^{th}$ column of the $k^{th}$ row includes h is equivalent to 2n when j is equivalent to n and k is equivalent to (n+1) to r, wherein n is a positive integer, and r is 5 in the present embodiment. For example, in the case that n is 1, the first electrodes 122 arranged in the $1^{st}$ column of the $2^{nd}$ to the $5^{th}$ row are connected to the $2^{nd}$ signal channel. In the case that n is 2, the first electrodes 122 of the $2^{nd}$ column of the $3^{rd}$ to the $5^{th}$ rows are connected to the $4^{th}$ signal channel. In the case that n is 4, the first electrode 122 of the $4^{th}$ column of the $5^{th}$ row are connected to the $8^{th}$ signal channel.

Once the first electrodes 122 and the second electrodes 124 are connected to the corresponding signal channels according to the above method, the signal lines 130 can connect together the adjacent ones of the first and/or the second electrodes 122/124 to be connected to the same signal channel and extend to the corresponding pads 200 so as to communicate to the corresponding signal channels. The above connection method of the signal lines 130 facilitates to simplifying the numbers of the lines and the layout design. Thereby, the touch panel 100a has novel layout design so as to simplify the fabrication method of the touch panel 100a and reduce the cost of fabricating the touch panel 100a.

Figure 3:
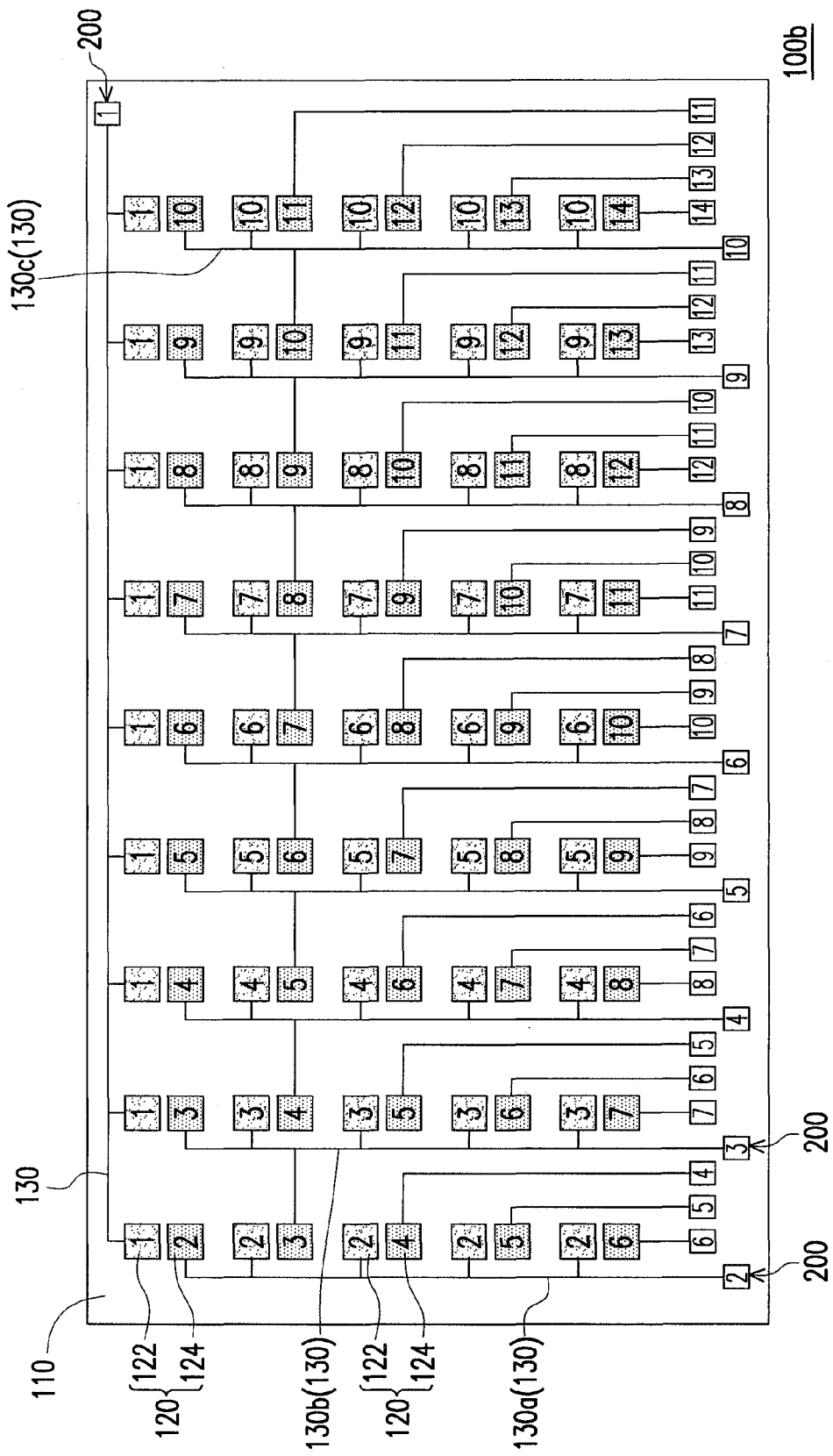
FIG. 3 is a schematic top view of a touch panel according to a second embodiment of the present invention.

FIG. 3 is a schematic top view of a touch panel according to a second embodiment of the present invention. Referring to FIG. 3, the touch panel 100b of the present embodiment is similar to the touch panel 100a depicted in FIG. 1 and the difference between the two lies in the connection method of the first electrode 122 connected to the corresponding signal channel.

Regarding the first electrodes 122, the first electrodes 122 can be connected to the signal channels in two different methods based on the arranged position thereof. The first connection method applied to the first electrodes 122 located at the $j^{th}$ column of the $k^{th}$ row includes h is equivalent to 1 when j is equivalent to 1 to q and k is equivalent to 1, wherein q is 9 in the present embodiment. Namely, the first electrodes 122 arranged in the $1^{st}$ to the $9^{th}$ columns of the $1^{st}$ row are connected to the $1^{st}$ signal channel through the corresponding pads 200.

The second connection method applied to the first electrodes 122 located at the $j^{th}$ column of the $k^{th}$ row includes h is equivalent to (n+1) when j is equivalent to n and k is equivalent to 2 to r, wherein n is a positive integer of 1~q, q is 9, and r is 5 in the present embodiment. Namely, in the case that n is 1, the first electrodes 122 arranged in the $1^{st}$ column of the $2^{nd}$ to the $5^{th}$ row are connected to the $2^{nd}$ signal channel. In the case that n is 2, the first electrodes 122 arranged in the $2^{nd}$ column of the $2^{nd}$ to the $5^{th}$ rows are connected to the $3^{rd}$ signal channel. In the case that n is 9, the first electrodes 122 arranged in the $9^{th}$ column of the $2^{nd}$ to the $5^{th}$ rows are connected to the $10^{th}$ signal channel.

In the present embodiment, the second electrode 124 satisfying j being equivalent to n and k being equivalent to 1 and the first electrodes 122 satisfying j being equivalent to n and k being equivalent to 2~r are connected to the same signal line 130, wherein n is 1~q, q is 9 and r is 5 in the present embodiment. Namely, in the case that n is 1, the second electrode 124 arranged in the $1^{st}$ column of the $1^{st}$ row and the first electrodes 122 arranged in the $1^{st}$ column of the $2^{nd}$ to the $5^{th}$ rows are connected to the same signal line 130a. In the case that n is 2, the second electrode 124 arranged in the $2^{nd}$ column of the $1^{st}$ row and the first electrodes 122 arranged in the $2^{nd}$ column of the $2^{nd}$ to the $5^{th}$ rows are connected to the same signal line 130b. Similarly, in the case that n is 9, the second electrode 124 arranged in the $9^{th}$ column of the $1^{st}$ row and the first electrodes 122 arranged in the $9^{th}$ column of the $2^{nd}$ to the $5^{th}$ rows are connected to the same signal line 130c.

Figure 4:
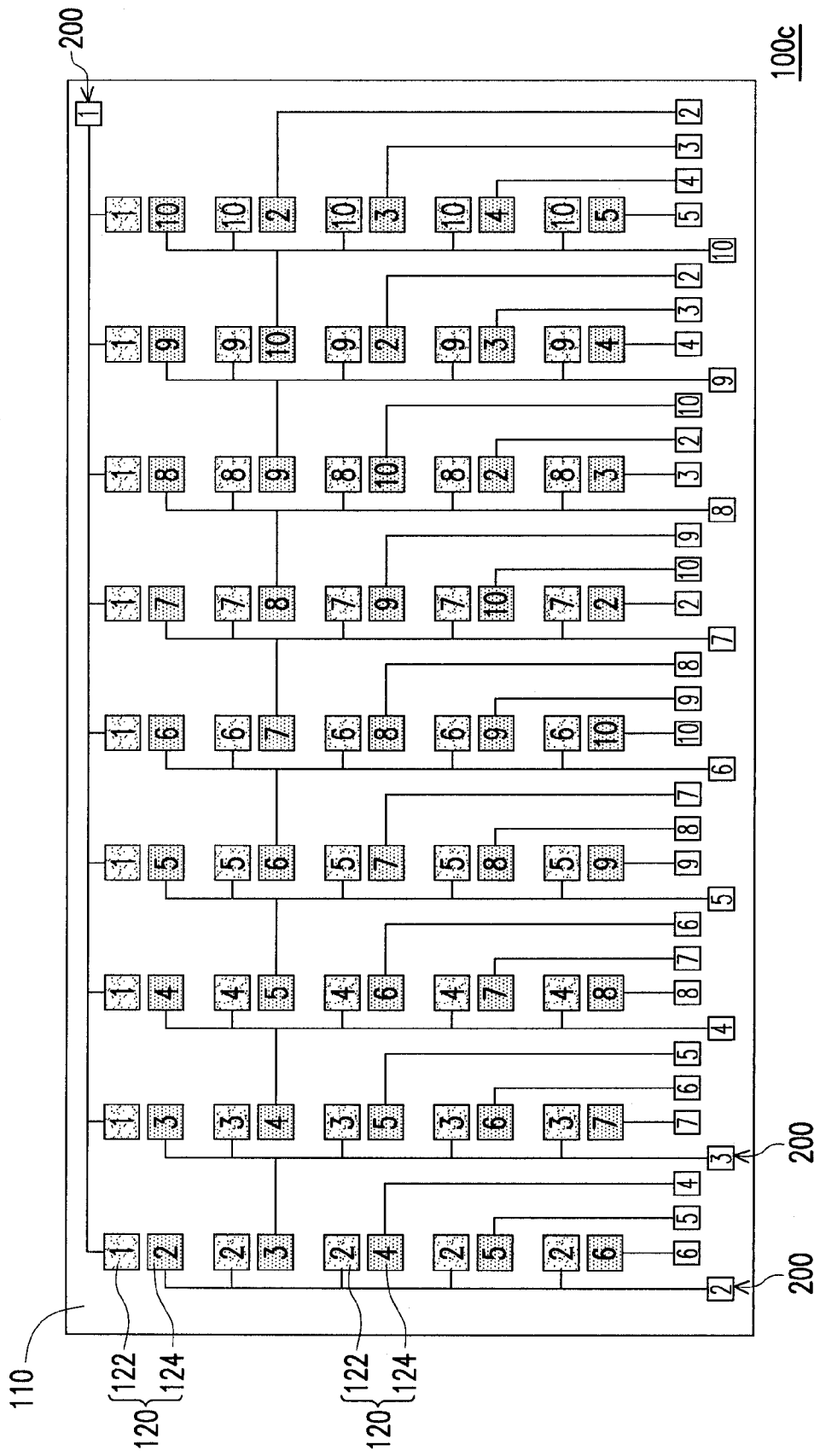
FIG. 4 is a schematic top view of a touch panel according to a third embodiment of the present invention.

FIG. 4 is a schematic top view of a touch panel according to a third embodiment of the present invention. Referring to FIG. 4, the touch panel 100c of the present embodiment is similar to the touch panel 100b depicted in FIG. 3 and the difference between the two lies in the connection method of the second electrodes 124 connected to the corresponding signal channel (the $i^{th}$ signal channel).

The first connection method applied to the second electrodes 124 located at the $j^{th}$ column of the $k^{th}$ row includes i is equivalent to (j+k) when (j+k) is smaller than or equivalent to (q+1), wherein q is 9 in the present embodiment. For example, the second electrode 124 located at the $3^{rd}$ column of the $4^{th}$ row can be connected to the $7^{th}$ signal channel. The second electrode 124 located at the $7^{th}$ column of the $3^{th}$ row can be connected to the $10^{th}$ signal channel. Furthermore, i is equivalent to (j+k−q) when (j+k) is greater than (q+1), wherein q is 9 in the present embodiment. For example, the second electrode 124 located at the $8^{th}$ column of the $3^{rd}$ row can be connected to the $2^{nd}$ signal channel. The second electrode 124 located at the $8^{th}$ column of the $5^{th}$ row can be connected to the $4^{th}$ signal channel.

In addition, in the second and the third embodiments of the invention, the amount of the signal lines 130 can be (r−1)q+2 and p can be 2r when the matrix of the electrode pairs 120 having q columns and r rows satisfies q being equivalent to (2r−1). For example, in the case that the electrode pairs 120 forms a matrix of 9 columns and 5 rows, the amount of the signal lines 130 can be 38 and the chip can include 10 signal channels connected to the touch panel. Such design facilitates to reducing the amount of the signal lines 130 and also reducing the required number of the signal channels in the chip. The chip design can be simplified and the volume of the chip can be reduced owing to the decrease of the number of the signal channels.

Once the first electrodes 122 and the second electrodes 124 are arranged in the above methods, the first electrode 122 and/or the second electrode 124 connected to the same signal channel and located nearby can be connected together through the signal lines 130 and connect with the corresponding signal channel by the extending of the signal lines 130. The above connection methods of the signal lines 130 facilitate to simplifying the layout design. Thereby, the touch panels 100b and 100c have novel layout design so as to simplify the fabrication method of the touch panels 100b and 100c and reduce the cost of fabricating the touch panels 100b and 100c.

In light of the forgoing, the touch panel according to the invention utilizes a design that the first electrode and the second electrode of the same electrode pair being connected with different signal channels and different electrode pairs being connected to different signal channel pairs. Accordingly, each of the first electrode and the second electrode in the same electrode pair can be served as the scanning electrode and the sensing electrode via the signal channels driven at different time sequences. Thereby, the sensing resolution of the touch panel can be improved.

Although the disclosure has been disclosed by the above embodiments, they are not intended to limit the disclosure. It will be apparent to people of ordinary skill in the art that modifications and variations to the structure of the disclosed embodiments may be made without departing from the spirit and the scope of the disclosure. Accordingly, the protection scope of the disclosure falls in the appended claims.

What is claimed is:

1. A touch panel connected to p signal channels of a chip, the touch panel comprising:
    a substrate;
    a plurality of electrode pairs, disposed on the substrate and arranged in a matrix of q columns and r rows, wherein p, q, and r are respectively a positive integer, and each of the electrode pairs comprises:
    a first electrode and a second electrode respectively connected to a $h^{th}$ signal channel and an $i^{th}$ signal channel of the chip, the $h^{th}$ signal channel and the $i^{th}$ signal channel served as a signal channel pair, each signal channel pair connected with one electrode pair arranged at a $j^{th}$ column and a $k^{th}$ row being different from another signal channel pair connected with each of the other electrode pairs, wherein h differs from i, h and i are respectively an integer of 1 to p, i is equal to j+k, j is an integer of 1 to q, k is an integer of 1 to r, h is equivalent to 1 when j is equivalent to a value of 1 to q and k is equivalent to 1, and h is equivalent to (n+1) when j is equivalent to n and k is equivalent to a value of 2 to r, and wherein the first electrode is scanned and the second electrode senses a touch at a first time sequence, and the first electrode senses the touch and the second electrode is scanned at a second time sequence; and
    a plurality of signal lines, each of the signal lines electrically connecting one of the first electrodes and the second electrodes in the electrode pairs to the corresponding signal channel and each of the first electrodes and the second electrodes belonging to a single signal channel, wherein at least one of the signal lines connects with at least two electrodes among the first electrodes and the second electrodes and the at least two electrodes are connected with a same signal channel.

2. The touch panel as claimed in claim 1, wherein the first electrode and the second electrode of the same electrode pair are separated by a gap.

3. The touch panel as claimed in claim 1, wherein q is equivalent to (2r−1), an amount of the signal lines is (r−1)q+2, and p is equivalent to 2r.

4. The touch panel as claimed in claim 3, wherein the second electrode of the electrode pair satisfying j being equivalent to n and k being equivalent to 1 and the first electrodes of the electrode pairs satisfying j being equivalent to n and k being from 2 to r are connected to a same signal line.

* * * * *